United States Patent [19]
Chae

[11] Patent Number: 5,432,122
[45] Date of Patent: Jul. 11, 1995

[54] METHOD OF MAKING A THIN FILM TRANSISTOR BY OVERLAPPING ANNEALING USING LASERS

[75] Inventor: Kie S. Chae, Kyunggi, Rep. of Korea

[73] Assignee: Gold Star Co., Ltd., Seoul, Rep. of Korea

[21] Appl. No.: 147,635

[22] Filed: Nov. 3, 1993

[30] Foreign Application Priority Data

Nov. 3, 1992 [KR] Rep. of Korea ............... 92-20521

[51] Int. Cl.⁶ ............................................. H01L 21/20
[52] U.S. Cl. ................................. 437/101; 437/40; 437/173; 437/233; 117/8; 117/10
[58] Field of Search ............... 437/40, 101, 173, 233; 117/8, 10

[56] References Cited

U.S. PATENT DOCUMENTS 4,309,225  1/1982  Fan et al. ........................ 427/53.1
4,439,245  3/1984  Wu ................................... 437/174

FOREIGN PATENT DOCUMENTS 63-46776  2/1988  Japan .
233935    2/1990  Japan .

OTHER PUBLICATIONS

Mortin et al. in "Displays, Technology and Applications", vol. 4(1), Jan. 1983, pp. 3-6.
Miyasaka et al. in Jap. Jr. Appl. Phys., vol. 30(12)B, Dec. 1991, pp. 3733-3740.
Little et al. in Jap. Jr. Appl. Phys., vol. 30(12)B, Dec. 1991, pp. 3724-3728.
Kuriyama et al. in "Jap. Jr. Appl. Phys.", vol. 30(12)B, Dec. 1991, pp. 3700-3703.

Primary Examiner—Nam Nguyen
Assistant Examiner—Ramamohan Rao
Attorney, Agent, or Firm—Helfgott & Karas

[57] ABSTRACT

The present invention provides a method of making a thin film transistor for driving a liquid crystal display comprising the steps of forming a gate electrode on a glass substrate and forming an insulating layer and an amorphous silicon layer in turn on said glass substrate and said gate electrode, and scanning laser beams on the surface of said amorphous silicon layer with the end portions of the respective scanned laser beams being overlapped. According to the method of making a thin film transistor for driving a liquid crystal display of the present invention, a thin film transistor suitable for HDTV, the field effect mobility of which is high, is achieved. Further, in making a thin film transistor, a separate processing step is not required and the number of processing steps can be reduced because constructional features of a TFT are utilized.

5 Claims, 6 Drawing Sheets

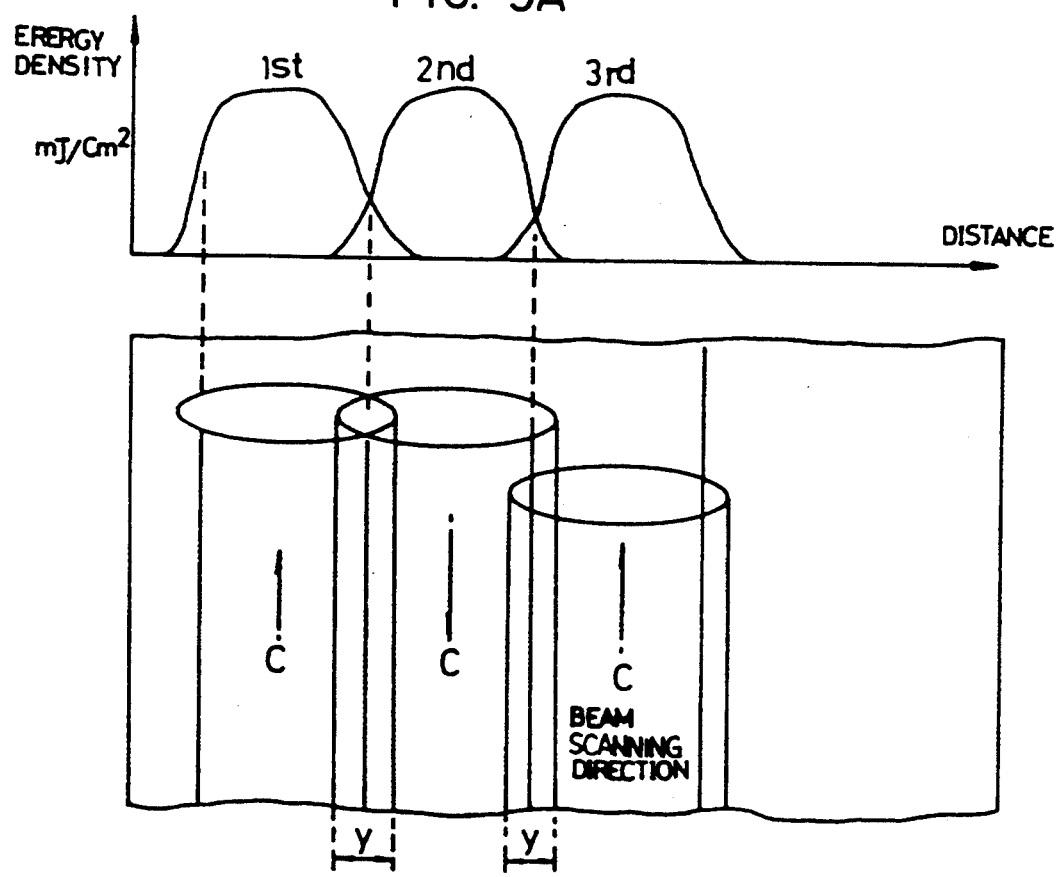

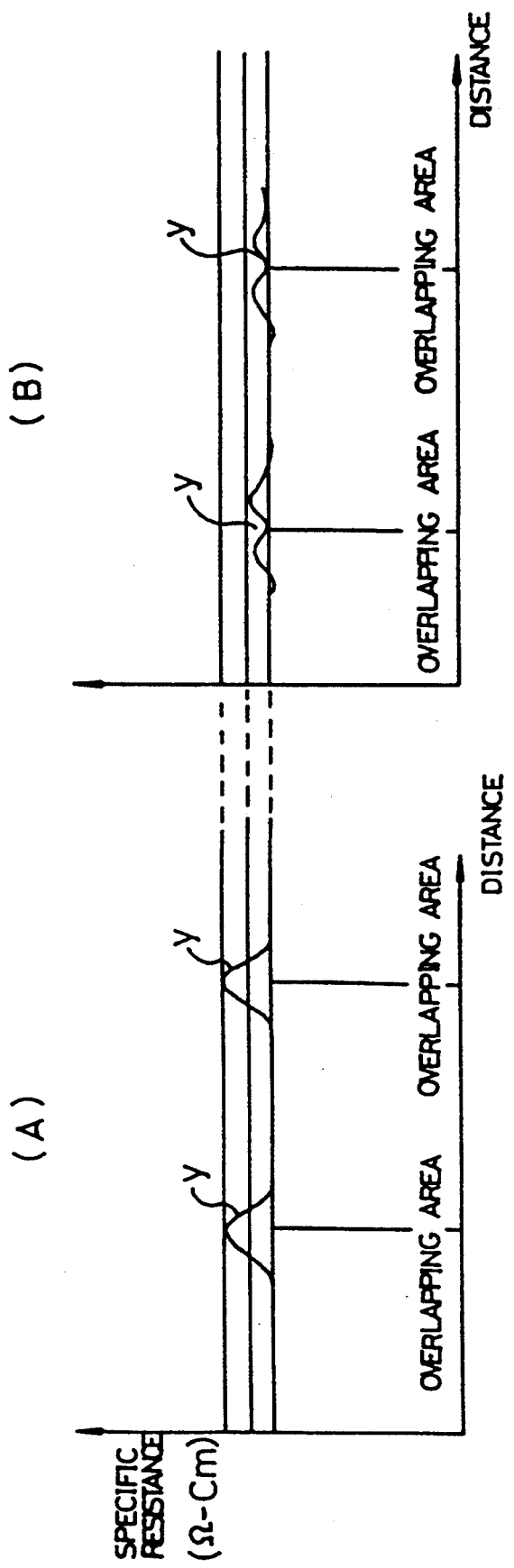

METHOD OF MAKING A THIN FILM TRANSISTOR BY OVERLAPPING ANNEALING USING LASERS

BACKGROUND OF THE INVENTION

1. Field of the Invention

The present invention relates to a method of making a thin film transistor (TFT) for driving a liquid crystal display (LCD), and more particularly to a method of making a TFT adequate to achieve picture quality of high resolution by improving recrystalization uniformity of the poly silicon layer obtained by laser beam processing.

2. Description of the Prior Art

A TFT LCD has the construction that high-integrated TFTs for driving an LCD are added thereon and has been developed and used as a main image device for portable televisions, wall-hanging type televisions, notebook type computers, etc., since it can provide high resolution picture quality.

FIG. 1 shows the construction of an amorphous silicon TFT, which is the kind of TFT used for the above-mentioned TFT LCD. In making such amorphous silicon TFT, a metal such as Cr, Ta, Ta alloy, Al, etc. is evaporated on a glass substrate 21 and then patterned to form a plurality of gates 22.

An insulating layer 23 is grown on the gate-formed glass substrate 21, and then amorphous silicon 24 is evaporated thereon and patterned.

On the patterned amorphous silicon 24, an n+-type amorphous silicon 25 is grown and patterned and on the patterned n+-type amorphous silicon 25, electrode metal 26 is coated, resulting in completion of amorphous silicon TFTs.

The amorphous silicon TFTs constructed as above can be used for driving the LCD as mentioned above. That is, as shown in FIG. 4, when voltage is applied to a gate electrode a, an electric signal is transmitted from source electrode b to drain electrode c, causing LCD d to be charged and driven. The characteristics of a TFT are dominated by the characteristics of amorphous silicon layer 24.

Usually, the field effect mobility of an amorphous silicon TFT is in the range of 0.5~1.0 cm$^2$/visec. And it has been reported that a TFT having field effect mobility of 4~5 Cm$^2$/visec is in development.

However, an amorphous silicon TFT has a relatively low field effect mobility as mentioned above, so that it is inadequate to drive an LCD having a large screen or for a high picture quality.

Furthermore, all manufacturing processes must be carried out below the temperature of about 600° C. because of the glass substrate.

Meanwhile, to improve the field effect mobility of a TFT, a method of making a TFT having a polysilicon layer recrystallized by a laser beam process has been proposed.

According to the above method, the temperature distribution is adjusted by forming an insulating layer having the configuration shown in FIGS. 2A and 2B or by adjusting the shape of laser beam as in FIG. 3 without the insulating layer in order to effect selective crystallization of the amorphous silicon layer.

In case selective crystallization is carried out by adjusting the temperature distributing using the thickness of the insulation layer, as shown in FIG. 2A, a crystal core is formed and grown in the part of the amorphous silicon layer placed under the convex part of the insulation layer owing to the warmth retention effect of the convex part of the insulating layer, thereby selective crystal-growing is accomplished and optical defects are concentrated in the concave part of the insulation layer, or as shown in FIG. 2B, optical defects are formed in the part of the amorphous silicon layer above the concave part of the insulation layer owing to the heat sink function of the convex part of the insulation layer under the amorphous silicon layer.

As shown in FIG. 3, in case crystallization is carried out by adjusting the beam shape by means of an optical system including a filter, a mode selector, a beam overlapper, a splitter, a lens, etc., a crystal core is formed along the M—M line and grows to either side of the beam, so that the active region of the TFT is positioned in the central part of the beam.

However, the method of making a TFT described as above has the disadvantage that it is required to form the insulating layer and perform a complicated etching process to make the insulation layer uneven prior to laser beam scanning as shown in FIG. 2.

Also, in case the insulation layer is formed too thinly, adjustment of the temperature distribution is incomplete, and thus, the process is delayed until the layer is formed with insulating thickness of more than 1 mm.

Furthermore, as shown in FIG. 3, in using an optical system including a filter, an aperture, etc., the degree of crystallization may be weakened owing to reduction of the power of the laser beam. And since the size of the beam is relatively small ($\phi$50 $\mu$m~$\phi$10 mm) in making a TFT for a large-scaled LCD, laser beam processing time is prolonged and the number of overlapping parts (6~8%) between beam scan lines increases, as well as making the position adjustment among the respective TFTs and the overlapping parts difficult.

SUMMARY OF THE INVENTION

It is an object of the present invention to provide a method of making a TFT for driving an LCD adequate to achieve LCD picture quality of high resolution by improving the characteristics of a poly silicon layer through selective crystallization of the polysilicon layer without adjusting the shape of the laser beam or etching to make the insulation layer uneven.

It is another object of the present invention to provide a method of making a TFT for driving an LCD by which the laser beam is scanned so that the energy density distribution of the laser beam is uniform and the number of overlapping parts of the laser beam is reduced.

In order to achieve the above objects, the present invention provides a method of making a TFT for driving an LCD comprising the steps of:

forming a gate electrode on a glass substrate and forming an insulating layer and an amorphous silicon layer in turn on said glass substrate and said gate electrode; and scanning laser beams on the surface of said amorphous silicon layer with the end portions of the respective scanned laser beams being overlapped.

In the step of scanning the laser beams, it is preferred to scan said laser beams through an optical system including prisms arranged at predetermined intervals so that the overlapped portions of the laser beams pass through the prisms. It is also preferred to scan the laser beam through a cylindrical lens or to scan the laser beam after applying a protective layer on said amorphous layer.

BRIEF DESCRIPTION OF THE DRAWINGS

The above object and other advantages of the present invention will become more apparent by describing the preferred embodiments thereof with reference to the accompanying drawings, in which:

FIG. 9 shows beam moving direction and energy density of laser beam in laser beam scanning according to the present invention.

FIG. 10A and B show recrystallization state of overlap part of laser beam respectively in cases of using and not using an optical system.

DETAILED DESCRIPTION OF PREFERRED EMBODIMENTS

Figure 5A:
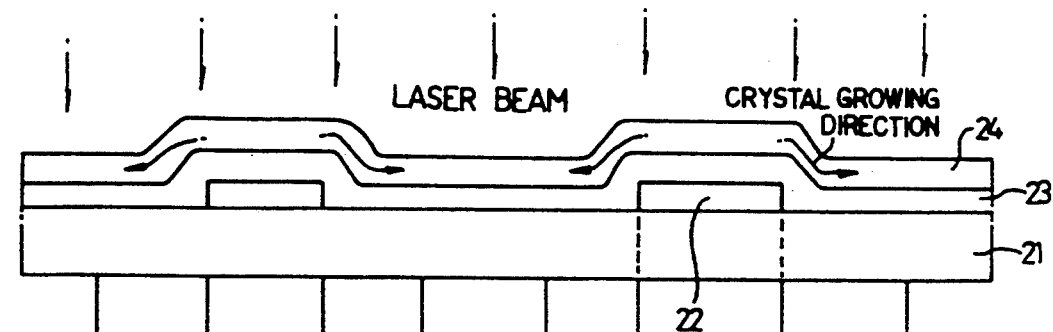
FIG. 5 shows a process of the formation of a crystal in an amorphous silicon layer by the scanning of a laser beam according to the present invention.
Figure 5B:
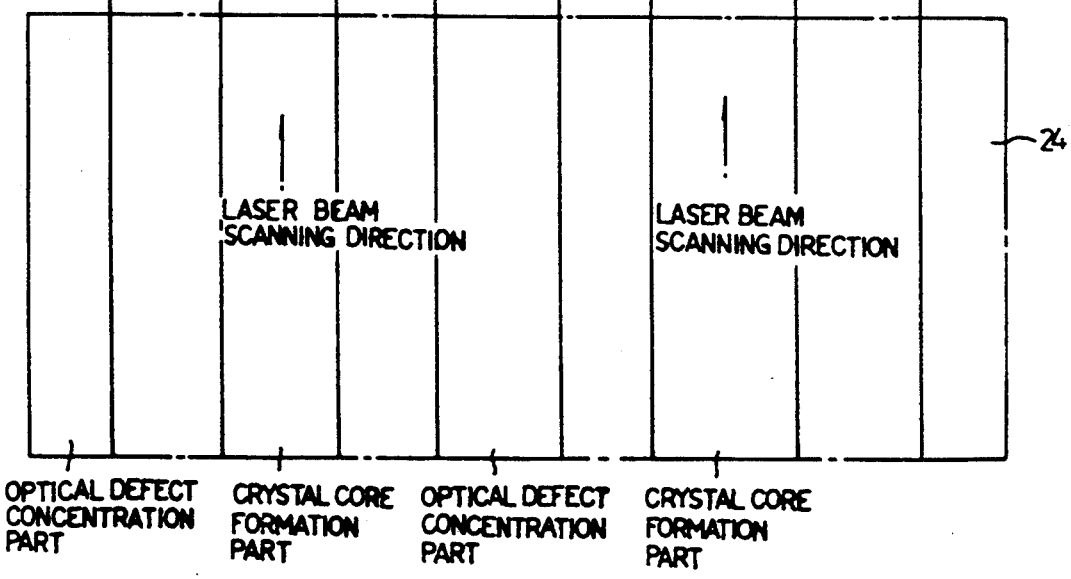

FIG. 5 shows a method of scanning a laser beam, formation of crystal core in an amorphous silicon layer and a transformation process for an amorphous silicon layer to polysilicon layer.

That is, by scanning laser beam (LB) after forming gate 22, insulating layer 23 and amorphous silicon layer 24 in turn on glass substrate 21, a crystal core is formed in said amorphous silicon layer near the gate metal owing to the heat sink effect of the gate metal which is an important region of a TFT, and thereby a silicon layer near the gate metal is hardened and optical defects are concentrated in a silicon layer between the gate metals, so that a TFT of excellent characteristics is achieved.

Figure 1:
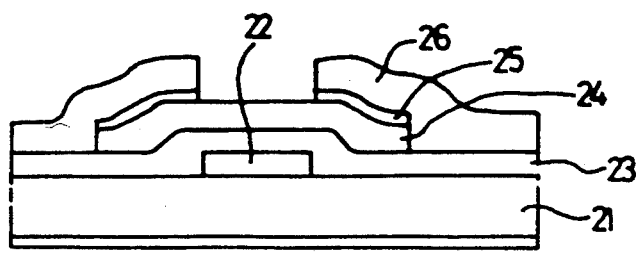
FIG. 1 is a sectional view of a conventional amorphous silicon thin film transistor.
Figure 2A:
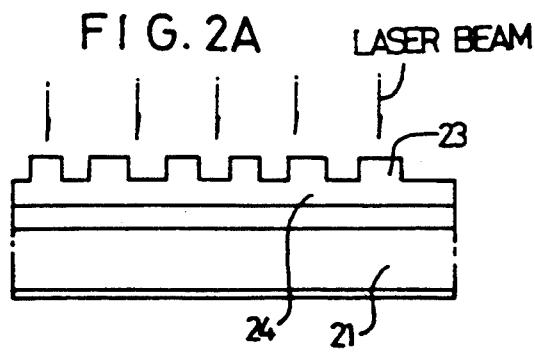
FIG. 2A and B are sectional views showing examples of a conventional method of selective crystallization using a laser.
Figure 2B:
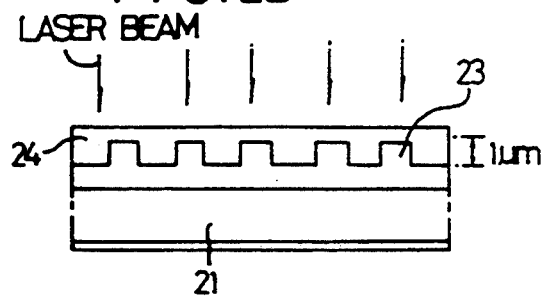
Figure 3:
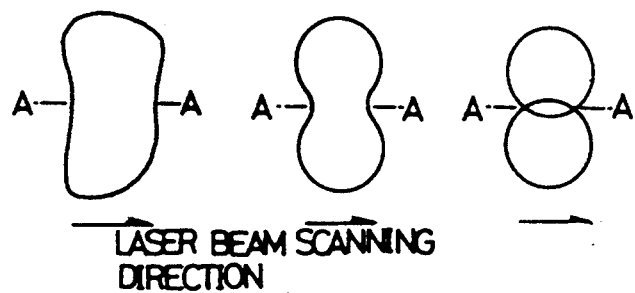
FIG. 3 shows an aspect of crystal growing to either side of a beam by a conventional method to crystallize selectively through regulation of the shape of laser beams.
Figure 4:
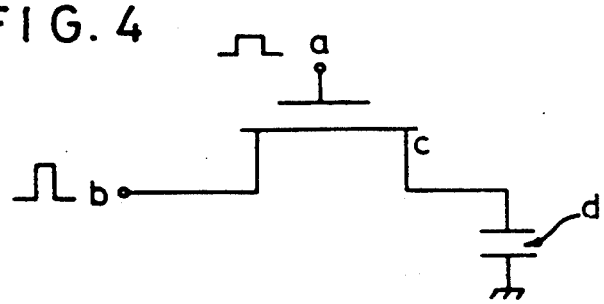
FIG. 4 is a circuit diagram explaining the operating principle of a conventional thin film transistor.
Figure 6:
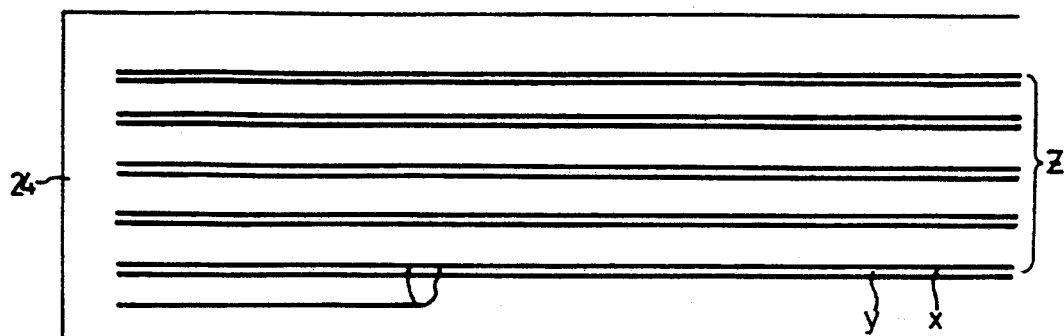
FIG. 6 shows a method of scanning laser beams to form overlap parts on the amorphous silicon layer with the end portions of the respective scanned laser beams being overlapped according to the present invention.

In scanning a laser beam (LB) on the surface of amorphous silicon layer 24 in turn, as shown in FIG. 6, total laser-processed part is completed by scanning laser beams with the end portions of the respective scanned laser beams being overlapped.

Figure 7:
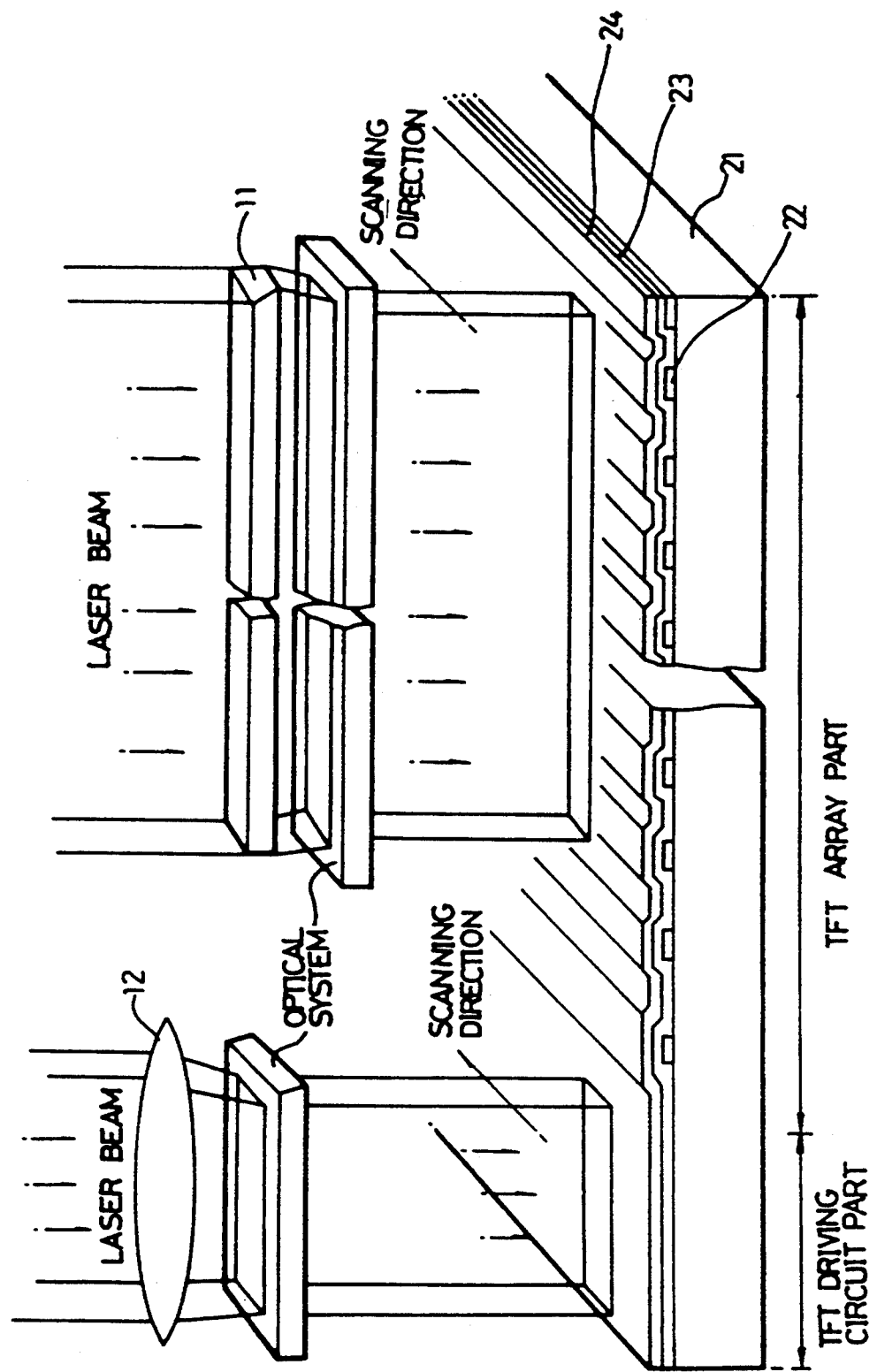
FIG. 7 shows a method of scanning a laser beam on the surface of an amorphous silicon layer according to one embodiment of the present invention.

Mean while, in the above method of scanning laser beam, because it is not necessary to regulate laser beam shape, it is possible to use all of the power of the laser beam without loss, so that it is possible to enlarge beam size with sufficient laser power in crystallization re-served. As shown in FIG. 7, on the LCD TFT array part it is possible to enlarge beam size using an optical system such as a cylindrical lens, and thereby, even for a picture plane of large area, it is possible to reduce the numbers of scanning laser beams and of overlap parts between beams (for a 14" picture plane, it is possible to reduce the number of scanning the laser beam to 2~4, thereby to reduce the number of overlap parts to 1~3). Meanwhile, on the array driving circuit, it may be used to scan a beam having a width of 10 mm through lens 12 without overlapping.

Meanwhile, the distribution of energy density of the respective laser beam has a shape similar to a trapezoid (that is, flat at the central part of the beam and inclined downward at either lateral end parts of the beam), and to complement this deficiency of energy at said lateral end parts scanning laser beam with the end portions of the respective scanned laser beams being overlapped is used by making lateral ends of the respective beam overlap each other; the distribution of energy density in this case is shown in FIG. 9. However, notwithstanding this overlapping scanning of laser beams, the distribution of energy density of laser beams does not become even, and the shape of the distribution of specific resistance of a poly silicon layer by laser beam scanning becomes very high at overlap part y as shown in FIG. 10.

To overcome this problem, optical system 3 including a plurality of regularly spaced prisms 2 can be disposed above TFT test piece 1 so that the intensity of the laser beam scanned on overlap part y between beams may become nearly equal to the intensity of the laser beam scanned on the non-overlap part.

Figure 8A:
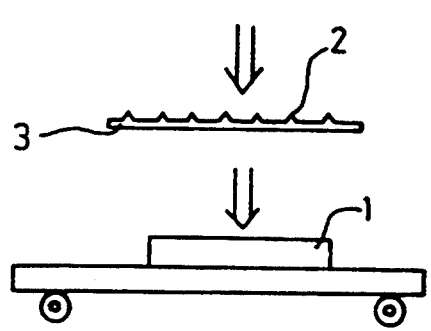
FIGS. 8A and 8B show a method of scanning a laser beam through an optical system including prisms arranged at predetermined intervals according to another embodiment of the present invention.
Figure 8B:
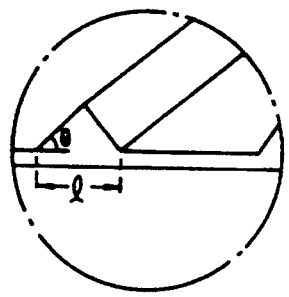
Figure 8C:
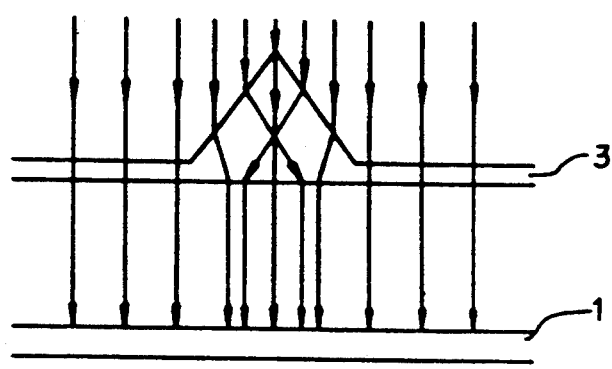
FIG. 8C shows an example of configuration of refraction of laser beam.

That is, if the laser beam is scanned through an optical system including prisms above the overlap parts, though the energy of the laser beam scanned on the overlap part y is lower than the energy of the laser beam scanned on part c, because the density of the laser beam rays scanned on overlap part y is increased due to the refraction of laser beam rays through prisms as shown in FIG. 8B the difference of optical efficiency between overlap part y and part c of TFT test piece 1 is compensated. The distribution of the poly silicon layer in scanning a laser beam through optical system 3 is illustrated in FIG. 10B.

Angle θ and width l of prism (2, see FIG. 8A) may be changed according to the energy distribution of the laser beam used. Meanwhile, the width of the laser beam may be changed according to the permissible energy and the focus length of the optical lens used, and thereby it is possible to use prisms which are not fixed but are movable according to the width of the laser beam respectively.

In scanning the laser beam, it is possible to scan a laser beam after applying a protective layer on an amorphous silicon layer, and a laser scanning device may be chosen from among an excimer laser, an argon laser and a ruby laser. The gate electrode of a TFT is preferred to be formed with Cr, Ta, Ta alloy, Al or a mixed layer of these metals, and in case of need, dual-gate construction may be chosen.

According to the method of making a TFT described above, field effect mobility can be increased by transforming an amorphous silicon TFT to a poly silicon TFT through a laser process, so that a TFT suitable for a picture plane of high resolution like HDTV results. Further, it is possible to regulate sub threshold-slop of TFT through regulation of laser power and beam area, and thereby it is possible to divide the gray-level displayed on LCD.

Furthermore, the increase of the uniformity of the silicon layer and the shortening of the processing time can be achieved by virtue of increase of beam area, and a separate processing step is not required and the number of processing steps can be reduced because the constructional features of a TFT are utilized in crystal core growing. Also, a TFT driving circuit can be made simultaneously with making of a TFT, and a TFT with dual gate construction can be made.

Furthermore, improvement of action characteristic of a TFT and easiness of processing can be achieved by elimination of the remaining defects and impure material in a poly silicon layer in recrystalization by laser beam, and the uniformity of picture quality of a TFT LCD can be improved in case of recrystallizing with laser beams passing through prisms.

What is claimed is:

1. A method of making a thin film transistor for driving a liquid crystal display comprising the steps of:
    forming a gate electrode on a glass substrate and forming an insulating layer and an amorphous silicon layer in turn on said glass substrate and said gate electrode;
    scanning laser beams on the surface of said amorphous silicon layer with the end portions of the respective scanned laser beams being overlapped; and
    scanning said laser beams through an optical system including prisms arranged at intervals so that the overlapped portions of the laser beams pass through the prisms for increasing the density of the laser beams scanned on overlapped portions compensating for a difference in optical efficiency between portions of the transistor scanned by the overlapped part of the laser beam and portions of the transistor scanned by a non-overlapped part of the laser beam.

2. A method of making thin film transistor for driving liquid crystal display as claimed in claim 1, wherein said laser beam is scanned through a cylindrical lens.

3. A method of making thin film transistor for driving a liquid crystal display as claimed in claim 1, further comprising a step of applying a protective layer on said amorphous silicon layer prior to scanning of said laser beam.

4. A method of making thin film transistor for driving liquid crystal display as claimed in claim 1, wherein the construction of said thin film transistor is dual gate construction.

5. A method of making a thin film transistor for driving a liquid crystal display comprising the steps of:
    forming a gate electrode on a glass substrate and forming an insulating layer and an amorphous silicon layer in turn on said glass substrate and said gate electrode;
    applying a protective layer on said amorphous silicon layer; and
    scanning laser beams on the surface of said amorphous silicon layer with the end portions of the respective scanned laser beams being overlapped.

* * * * *